(12) United States Patent
Li et al.

(10) Patent No.: US 7,008,833 B2
(45) Date of Patent: Mar. 7, 2006

(54) IN₂O₃ THIN FILM RESISTIVITY CONTROL BY DOPING METAL OXIDE INSULATOR FOR MFMOX DEVICE APPLICATIONS

(75) Inventors: Tingkai Li, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 109 days.

(21) Appl. No.: 10/755,419

(22) Filed: Jan. 12, 2004

(65) Prior Publication Data
US 2005/0151210 A1    Jul. 14, 2005

(51) Int. Cl.
H01L 21/336    (2006.01)

(52) U.S. Cl. .................. 438/197; 438/253; 438/257; 438/301

(58) Field of Classification Search .............. 438/142, 438/197, 257, 299, 301, 253
See application file for complete search history.

(56) References Cited

U.S. PATENT DOCUMENTS

| | | | |
|---|---|---|---|
| 5,303,182 A | 4/1994 | Nakao et al. | |
| 5,365,094 A | 11/1994 | Takasu | |
| 5,561,307 A * | 10/1996 | Mihara et al. | 257/295 |
| 5,621,681 A | 4/1997 | Moon | |
| 5,731,608 A | 3/1998 | Hsu et al. | |
| 5,744,374 A | 4/1998 | Moon | |
| 5,812,442 A | 9/1998 | Yoo | |
| 5,932,904 A | 8/1999 | Hsu et al. | |
| 5,942,776 A | 8/1999 | Hsu et al. | |
| 5,962,884 A | 10/1999 | Hsu et al. | |
| 6,011,285 A | 1/2000 | Hsu et al. | |
| 6,018,171 A | 1/2000 | Hsu et al. | |
| 6,069,381 A | 5/2000 | Black et al. | |
| 6,087,688 A * | 7/2000 | Furuta et al. | 257/295 |
| 6,117,691 A | 9/2000 | Hsu et al. | |
| 6,146,904 A | 11/2000 | Hsu et al. | |
| 6,151,240 A * | 11/2000 | Suzuki | 365/145 |
| 6,225,655 B1 * | 5/2001 | Moise et al. | 257/295 |
| 6,362,499 B1 | 3/2002 | Moise et al. | |
| 6,420,742 B1 | 7/2002 | Ahn et al. | |
| 6,498,362 B1 | 12/2002 | Forbes et al. | |
| 6,503,763 B1 | 1/2003 | Li et al. | |
| 6,531,325 B1 | 3/2003 | Hsu et al. | |
| 6,538,273 B1 | 3/2003 | Willer et al. | |
| 6,713,358 B1 * | 3/2004 | Chau et al. | 438/287 |
| 2002/0142487 A1 * | 10/2002 | Li et al. | 438/3 |
| 2002/0177244 A1 * | 11/2002 | Hsu et al. | 438/3 |
| 2003/0213975 A1 * | 11/2003 | Hirose et al. | 257/194 |

* cited by examiner

Primary Examiner—T. N. Quach
(74) Attorney, Agent, or Firm—David C. Ripma; Joseph Curtin; David Cordeiro

(57) ABSTRACT

The present invention discloses a novel ferroelectric transistor design using a resistive oxide film in place of the gate dielectric. By replacing the gate dielectric with a resistive oxide film, and by optimizing the value of the film resistance, the bottom gate of the ferroelectric layer is electrically connected to the silicon substrate, eliminating the trapped charge effect and resulting in the improvement of the memory retention characteristics. The resistive oxide film is preferably a doped conductive oxide in which a conductive oxide is doped with an impurity species. The doped conductive oxide is most preferred to be $In_2O_3$ with the dopant species being hafnium oxide, zirconium oxide, lanthanum oxide, or aluminum oxide.

18 Claims, 13 Drawing Sheets

IN₂O₃ THIN FILM RESISTIVITY CONTROL BY DOPING METAL OXIDE INSULATOR FOR MFMOX DEVICE APPLICATIONS

FIELD OF THE INVENTION

This invention relates generally to semiconductor device and nonvolatile memory transistor, and more particularly to ferroelectric gate transistor structures and methods of fabrication.

BACKGROUND OF THE INVENTION

Ferroelectric materials are composed of many randomly-distributed permanently polarized regions. Under the presence of an electric field, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. A negative coercive field is required to bring the polarization to zero. This hysteresis behavior of a ferroelectric material is the basis of ferroelectric nonvolatile memory devices.

Currently there are two types of ferroelectric nonvolatile memory devices: ferroelectric capacitor which uses a transistor to detect the polarization of a ferroelectric capacitor, and ferroelectric transistor which detects a change in the transistor conductance caused by the polarization of a ferroelectric gate material. The ferroelectric transistor is much more advantageous than the ferroelectric capacitor due to the smaller surface area which enables higher density memory chip, and the non-destructive readout which significantly reduces the fatigue problem.

The ferroelectric transistor is typically a ferroelectric-gate-controlled semiconductor field-effect transistor (FET), which employs a ferroelectric film in the gate stack of the FET, and in which a proper polarization of the ferroelectric film can create an inversion layer in the channel region of the transistor. The basic ferroelectric-gate controlled field-effect transistor is a metal-ferroelectric silicon (MFS) FET. The term MFS represents the layers in the gate stack of the ferroelectric transistor. Thus the gate stack of the MFS transistor consists of a metal (M) gate electrode disposed on a ferroelectric (F) gate dielectric on the silicon (S) channel of the transistor. FIG. 1 shows the schematic of an n-channel MFS transistor. A ferroelectric film 12 is formed as a gate insulating film on a p-type silicon substrate 13, together with source 14 and drain 15 regions having a high concentration of n-type impurity ions. A metal gate electrode 11 is formed over the ferroelectric film 12. The MFS transistor is isolated by the isolation trenches 16.

However, effective transistor operation of the above MFS transistor is difficult to achieve due to the requirement of the ferroelectric/silicon interface. When a ferroelectric film is deposited directly on the silicon substrate, metals and oxygen from the ferroelectric layer may diffuse into the ferroelectric-silicon interface, creating interface trapped charges which affect the polarization of the ferroelectric film, and overall may make the operation of the ferroelectric transistor unstable. Further, since the thermal expansion coefficient and lattice structure of a ferroelectric film is not compatible with silicon, it is very difficult to form a high-quality ferroelectric film with a clean interface directly on the silicon substrate.

To address the drawbacks posed by the direct ferroelectric/silicon interface, a gate dielectric can be inserted between the ferroelectric film and the silicon substrate. The ferroelectric transistor is then called metal-ferroelectric-oxide (or insulator) silicon (MFOS or MFIS) FET. FIG. 2A shows a MFOS memory transistor using a gate oxide layer 27 formed between the silicon substrate 13 and the ferroelectric film 12. Alternatively, a metal floating gate layer 28 can be added between the ferroelectric film 12 and the gate oxide layer 27 as shown in FIG. 2B for a metal-ferroelectric-metal-oxide (or insulator) silicon (MFMOS or MFMIS) transistor. A suitable conducting material (e.g. Pt or Ir) is normally selected for the floating gate 28 to allow the deposition of the ferroelectric thin film and to prevent diffusion of the ferroelectric material into the gate dielectric and the channel. The floating gate layer 28 is also called bottom electrode, or bottom gate, in reference to the other gate electrode 11, called top electrode, or top gate.

Such gate stack structures (metal-ferroelectric-oxide gate stack or metal-ferroelectric-metal-oxide gate stack) overcome the surface interface and surface state issues of a ferroelectric layer in contact with the silicon substrate. However, they incorporate other difficulties such as higher operation voltage and trapped charges in the bottom floating gate layer. The operation voltage of these transistors is higher than the ferroelectric layer programming voltage by an amount of the voltage across the gate dielectric. And when there is a voltage applied across the ferroelectric thin film, there will be current flow in the gate stack, and charges would be trapped in this floating electrode. The trapped charges may neutralize the polarization charges at the interface of the bottom electrode and the ferroelectric film and could shorten the memory retention time of this structure.

Various prior designs have been disclosed to compensate for the trapped charges in the floating bottom electrode. One of the prior art design to reduce the trapped charges in the lower electrode is the formation of a Schottky diode such as a metal-ferroelectric-metal silicon (MFMS) device disclosed in Nakao et al., U.S. Pat. No. 5,303,182, entitled "Nonvolatile semiconductor memory utilizing a ferroelectric film". A Schottky barrier is formed between the bottom metal electrode of the gate unit (or a very shallow junction layer) and the silicon substrate. The Schottky ferroelectric gate memory transistor requires a space between the bottom electrode and the source and drain region or a very shallow n-channel under the gate, therefore the drive current of the Schottky ferroelectric gate memory transistor can be relatively low. Hsu et al., U.S. Pat. No. 5,731,608, entittled "One transistor ferroelectric memory cell and method of making the same", and its continuations and divisions (U.S. Pat. Nos. 5,962,884; 6,117,691; 6,018,171; 5,942,776; 5,932,904; 6,146,904; 6,011,285; 6,531,325), hereby incorporated by reference, disclose a distance between 50 to 300 nm from the bottom metal electrode to the source and drain to reduce the possible high leakage current due to the increased field intensity at the metal edge of the Schottky diode because of the sharp edge at the periphery of the metal contact. Alternatively, Willer et al., U.S. Pat. No. 6,538,273, entittled "Ferroelectric transistor and method for fabricating it", discloses a recess of the source and drain below the surface of the semiconductor surface in a Schottky ferroelectric gate memory transistor.

Another design to reduce the trapped charges in the lower electrode is to provide a conduction path for the lower electrode. Black et al., U.S. Pat. No. 6,069,381, entitled "Ferroelectric memory transistor with resistively coupled floating gate" discloses an integrated resistor in the form of a spacer between the bottom floating gate electrode and the source/drain to remove the trapped charges. Moise et al., U.S. Pat. No. 6,225,655 and its continuation U.S. Pat. No. 6,362,499, entitled "Ferroelectric transistors using thin film semiconductor gate electrodes" disclose an external resistor connecting the lower electrode to ground to drain the trapped charges. This additional resistor ensures that the potential of the floating gate will approach that of the source/drain region after a certain delay time, but this could affect the high speed switching characteristic of the ferroelectric memory. Yoo, U.S. Pat. No. 5,812,442, entitled "Ferroelectric memory using leakage current and multi-numerical system ferroelectric memory" discloses a leakage gate dielectric to remove the trapped charges through the silicon channel. The leakage current is generated by a Schottky emission or a Frankel-Poole emission or Fowler-Nordheim tunneling to reduce the bound charges in the bottom metal electrode.

SUMMARY OF THE INVENTION

The present invention discloses a novel design to reduce the trapped charges in the ferroelectric transistor operation by the use of a resistive oxide film in place of the gate dielectric, fabricated with proper resistance value to optimize the performance of the ferroelectric transistor. By replacing the gate dielectric with a resistive oxide film, and by optimizing the value of the film resistance, the bottom gate of the ferroelectric layer is electrically connected to the silicon substrate, therefore the floating gate effect can be eliminated, resulting in the improvement of the memory retention characteristics. Furthermore, the operating voltage for the ferroelectric transistor can be reduced because of the absence of the gate dielectric.

The resistive oxide film is preferably a doped conductive oxide which is a conductive oxide doped with an impurity species. By varying the dopant concentration and other fabrication process parameters, the resistive oxide film can achieve a wide range of resistance suitable for the optimization of the ferroelectric transistor performance. The doped conductive oxide is most preferred to be $In_2O_3$ with the dopant species being hafnium oxide, zirconium oxide, lanthanum oxide, or aluminum oxide.

The present invention ferroelectric transistor can be a metal-ferroelectric-metal-doped conductive oxide silicon (MFMRS) FET. The gate stack of the MFMRS transistor has a top metal electrode (or top gate) disposed on a ferroelectric layer disposed on a bottom metal electrode (or bottom gate) disposed on a doped conductive oxide layer on the silicon substrate. The present invention ferroelectric transistor can also be a metal-ferroelectric-doped conductive oxide silicon (MFRS) FET. The gate stack of the MFRS transistor has a top metal electrode (or top gate) disposed on a ferroelectric layer disposed on a doped conductive oxide layer on the silicon substrate.

The resistive doped conductive oxide further can have the advantages of possible lattice matching with the ferroelectric layer, reducing or eliminating the oxygen diffusion problem at the ferroelectric interface to improve the reliability of the ferroelectric transistor, and possible etch selectivity improvement with other dielectric and metal films.

The fabrication process of the present invention ferroelectric transistor can be performed by a gate etching process or by a replacement gate process. In the gate etching process, the multilayer gate stack is deposited and etched, while in the replacement gate process, a replacement gate stack is deposited as a place holder for the fabrication of other portions of the device, then the replacement gate stack is removed and the functional gate stack is deposited.

DETAILED DESCRIPTION OF THE INVENTION

Figure 1:
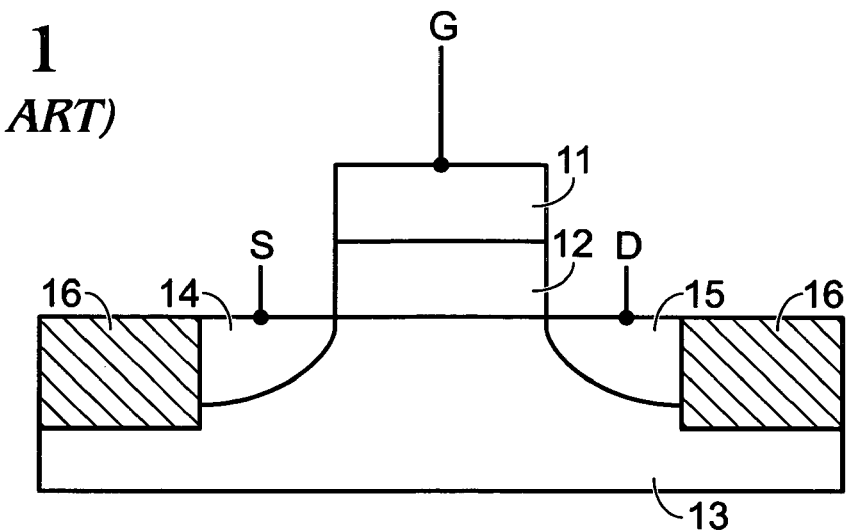
FIG. 1 shows a typical ferroelectric-gate-controlled semiconductor field-effect transistor (FET) which is a metal-ferroelectric silicon (MFS) FET.
Figure 2A:
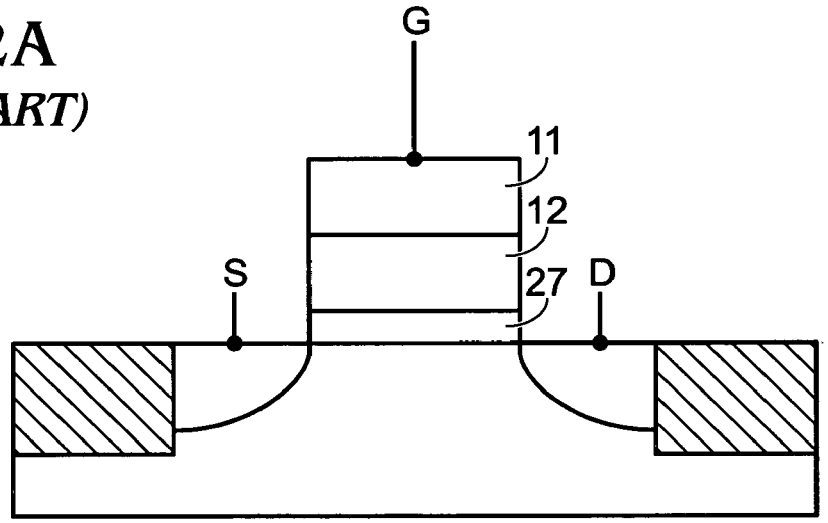
FIG. 2A shows a schematic of a metal-ferroelectric-oxide silicon MFOS transistor.
Figure 2B:
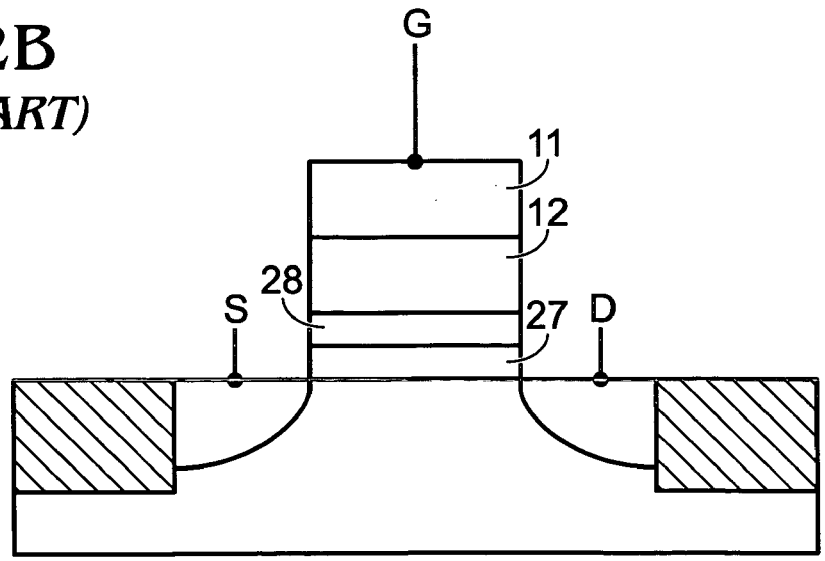
FIG. 2B shows a schematic of a metal-ferroelectric-metal-oxide silicon MFMOS transistor.

The ferroelectric transistor of the present invention is a ferroelectric field effect transistor having a resistive oxide layer replacing the gate dielectric. By replacing the gate dielectric with a resistive oxide layer, the ferroelectric layer is electrically connected to the substrate, and thus eliminating the trapped charges effect. Further, by using a resistive oxide layer comprising oxygen component, the silicon interfacial property of the resistive oxide layer is comparable with that of the gate dielectric, and the resistance of the resistive oxide layer would not vary significantly after subsequent processes of anneal and oxygen exposure. The resistance of the resistive oxide layer can be adjustable through fabrication process variations and thus can be optimized to achieve the best performance for the ferroelectric transistor. In the limits of the present invention, when the resistive oxide layer is non-conductive, it behaves as a gate dielectric in a conventional ferroelectric transistor. When the resistive oxide layer is highly conductive (i.e. negligible film resistivity), the ferroelectric transistor behaves as a conductive oxide ferroelectric transistor, disclosed by the same inventors in a co-pending application "Conductive metal oxide gate ferroelectric memory transistor", hereby incorporated by reference.

The disclosed resistive oxide film is substantially ohmic, meaning for a given film thickness, the resistance of the resistive film is substantially constant with respect to the applied voltage (with preferably less than 20% variation), or the current running through the resistive film is substantially linear with respect to the applied voltage. The advantages of using ohmic resistive oxide layer are the ease of fabrication process, the ease of device design and simulation since the I-V characteristics of the resistive oxide film is substantially linear due to the ohmic law, markedly advantageous than non-linear I-V characteristics such as the leakage current generated by a Schottky emission or a Frankel-Poole emission or Fowler-Nordheim tunneling.

The resistive oxide film in the present invention is preferably a doped conductive oxide film in which the conductive oxide is doped with an impurity species or a variety of impurity species to modify its resistance. The doped conductive oxide preferably exhibits ohmic behavior, meaning having an I-V characteristic that is substantially linear. The conductive oxide film is preferably a conductive oxide film of any one metal selected from a group of Mo, W, Tc, Re, Ru, Os, Rh, Ir, Pd, Pt, In, Zn, Sn, Sr—Ru or Sr—Co (such as $IrO_2$ and $RuO_2$), or a rock-salt (NaCl) crystal structure face-centered cubic metal oxide, such as NdO, NbO, SmO, LaO, and VO. The preferred method of forming the conductive oxide is by deposition. However, other methods may be used such as doping by diffusion and ion implantation. For example, the conductive oxide can be boron (B) doped or fluorine (F) doped ZnO and antimony (Sb) doped or fluorine (F) doped $SnO_2$.

The conductive oxide may be composed of any number of conductive perovskite oxides such as lanthanum strontium cobalt oxide (LSCO). Typical examples of simple perovskite oxides are expressed by the general formula $ABO_3$ such as $SrRuO_3$ or $LaNiO_3$, where AB can be any combination of (A=Ca, Sr) (B=V, Cr, Fe, Ru), (A=La)(B=Ti, Co, Ni, Cu), (A=H, Li, Na, K)(B=Re, Mo, Nb), (A=$La_{1-x}Sr_x$)(B=V, Mn, Co). Another example of conductive perovskite oxides is expressed by the general formula $A_2B_2O_7$ where (A=Bi, Pd)(B=$Ru_{1-x}Bi_x$, $Ru_{1-x}Pb_x$). Examples of layered perovskite oxides include CaTiO, $(Sr(Ru, Ir, Cr)O_3)(SrO)_n$ such as $SrRuO_3$, $SrIrO_3$, $Sr_2RuO_4$, $Sr_2IrO_4$ and $Ba_2RuO_4$. The conductive oxide film can also include high temperature superconducting oxides such as $La_{1-x}Sr_xCuO_4$, $Nd_{1-x}Ce_xCuO_4$, $YBa_2Cu_3O_7$, $Bi_2Sr_2Ca_{n-1}Cu_nO_{2n+4}$, $(Nd_{1-x}Ce_x)_2CuO_4$. See, for example, Suzuki, U.S. Pat. No. 6,151,240, entitled "Ferroelectric nonvolatile memory and oxide multi-layered structure", hereby incorporated by reference.

The impurity species is preferably an insulator material, and amorphously distributed throughout the conductive oxide film. The impurity species is preferably an element or its non-conductive oxide such as hafnium or hafnium oxide ($HfO_2$ and its variants of oxygen-rich or oxygen-deficiency $HfO_x$), zirconium or zirconium oxide ($ZrO_2$ and its variants of oxygen-rich or oxygen-deficiency $ZrO_x$), lanthanum or lanthanum oxide ($LaO_2$ and its variants of oxygen-rich or oxygen-deficiency $LaO_x$), or aluminum or aluminum oxide ($Al_2O_3$ and its variants of oxygen-rich or oxygen-deficiency $AlO_x$).

The conductive oxide is most preferred to be $In_2O_3$ with the dopant species being hafnium, zirconium, lanthanum, aluminum or their oxides. Doping with an element, for example hafnium, will likely generate hafnium oxide due to the presence of oxygen in the conductive oxide film. The following experiment demonstrates the feasibility of the fabrication of a typical resistive oxide film of conductive oxide $In_2O_3$ doped with hafnium/hafnium oxide where its phase, grain size and resistance can be controlled by various deposition parameters and post annealing process conditions. The doped indium oxide film is deposited by sputtering (physical vapor deposition, PVD) process in this experiment, but other deposition processes such as chemical vapor deposition (CVD), evaporation, atomic layer deposition (ALD) can be used. Using an indium target together with a hafnium target in the presence of oxygen plasma, hafnium/hafnium oxide doped indium oxide films with various physical and electrical properties can be fabricated. The deposition conditions are typically 200–300 W of DC sputtering power, 0–60% of oxygen partial pressure, 20–200° C. substrate temperature, 400–850° C. post annealing temperature with silicon, silicon dioxide substrates and with or without platinum or platinum/titanium underlayer. The silicon substrate can be cleaned in HF (50:1) for 5 seconds before indium oxide deposition.

Figure 3:
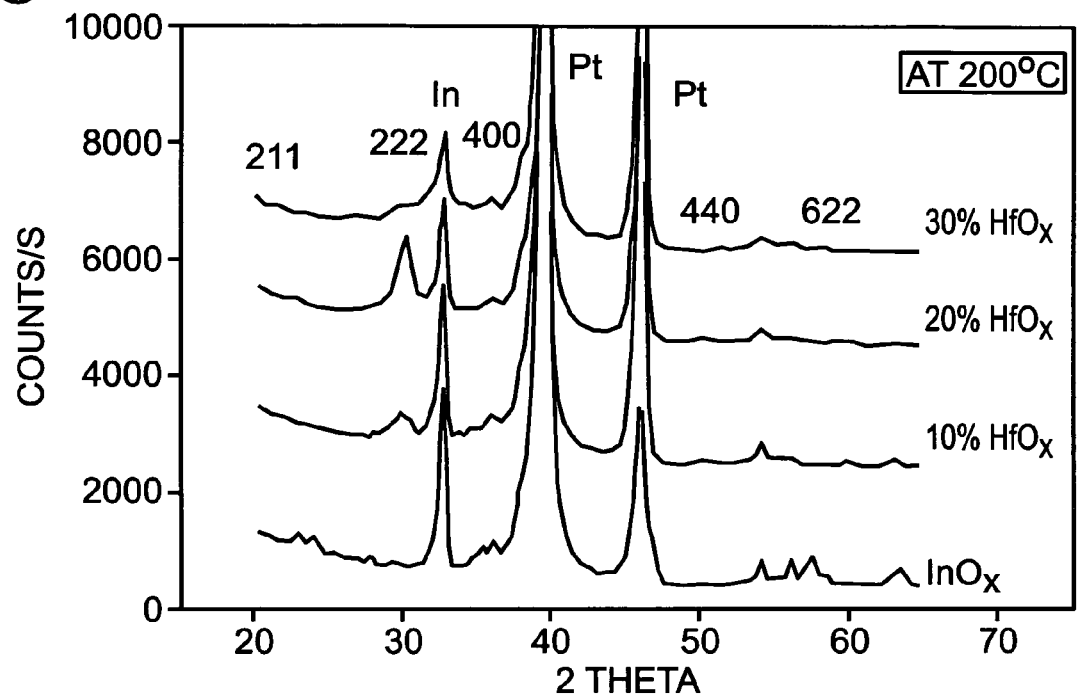
FIG. 3 shows the X-ray patterns of doped $In_2O_3$ thin films with various hafnium oxide contents.
Figure 4A:
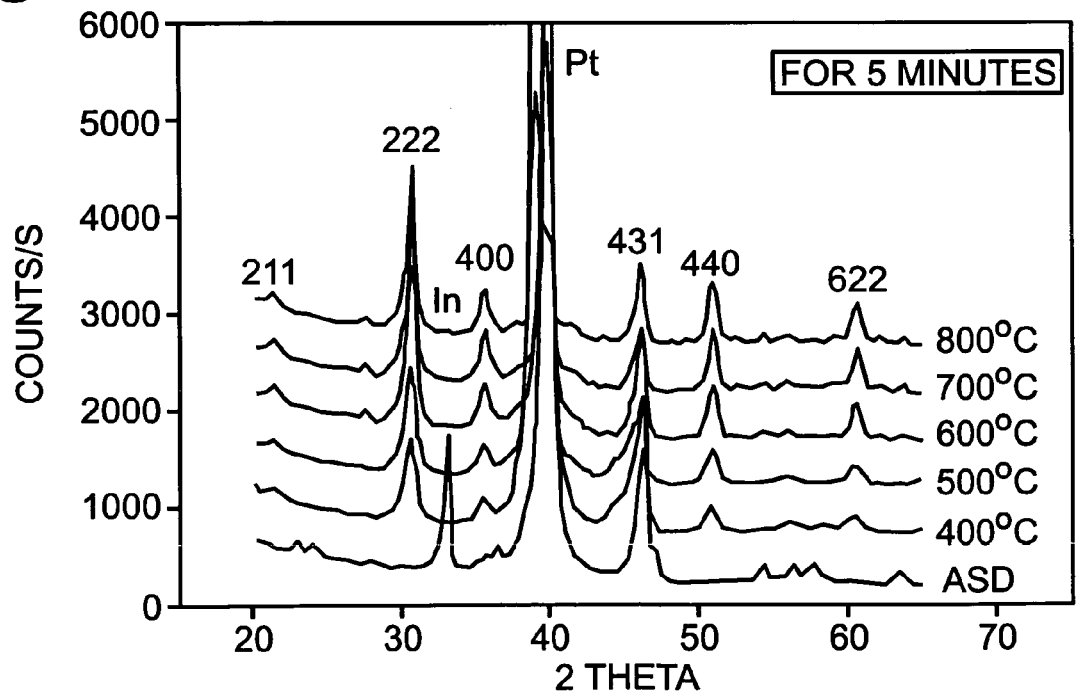
FIGS. 4A–D show the X-ray patterns of doped $In_2O_3$ thin films with different post annealing temperatures.
Figure 4B:
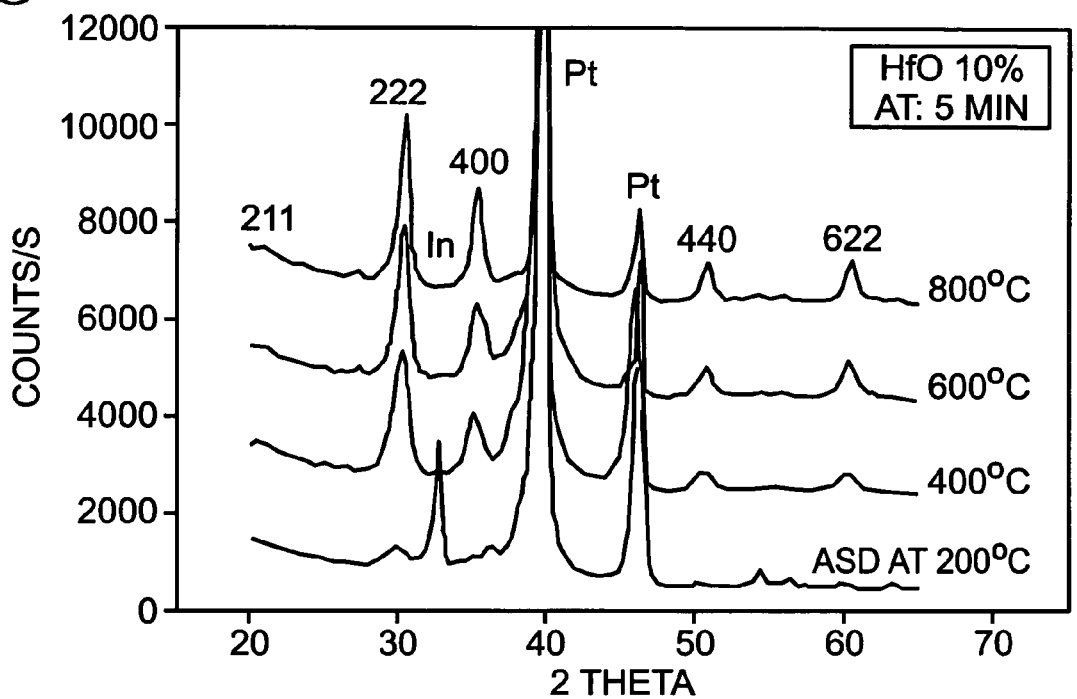
Figure 4C:
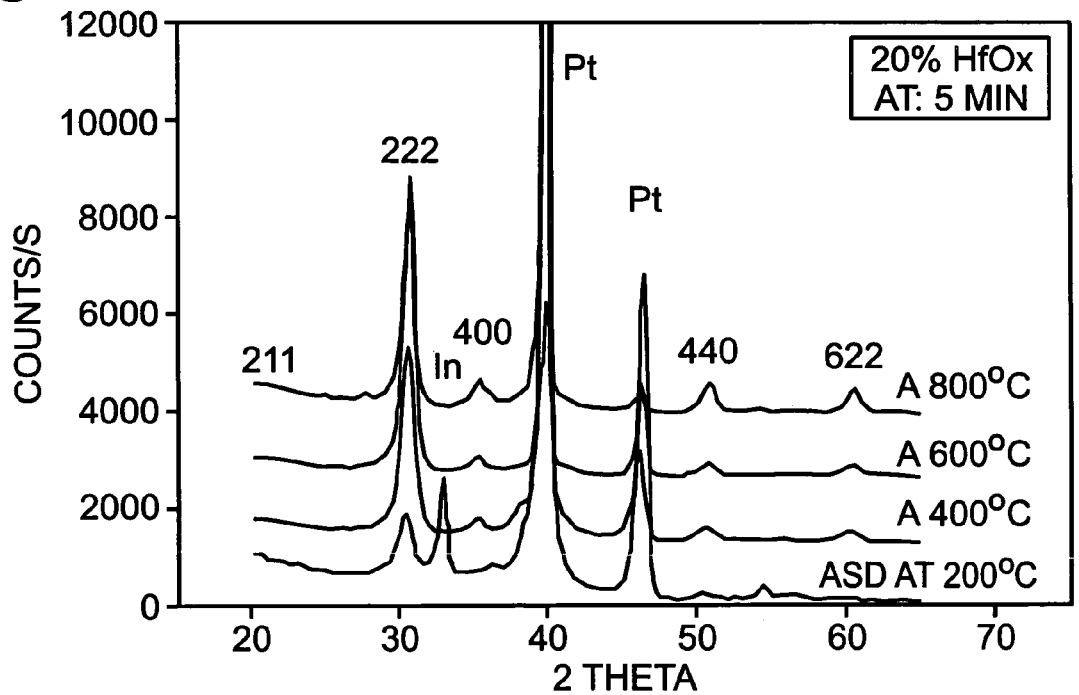
Figure 4D:
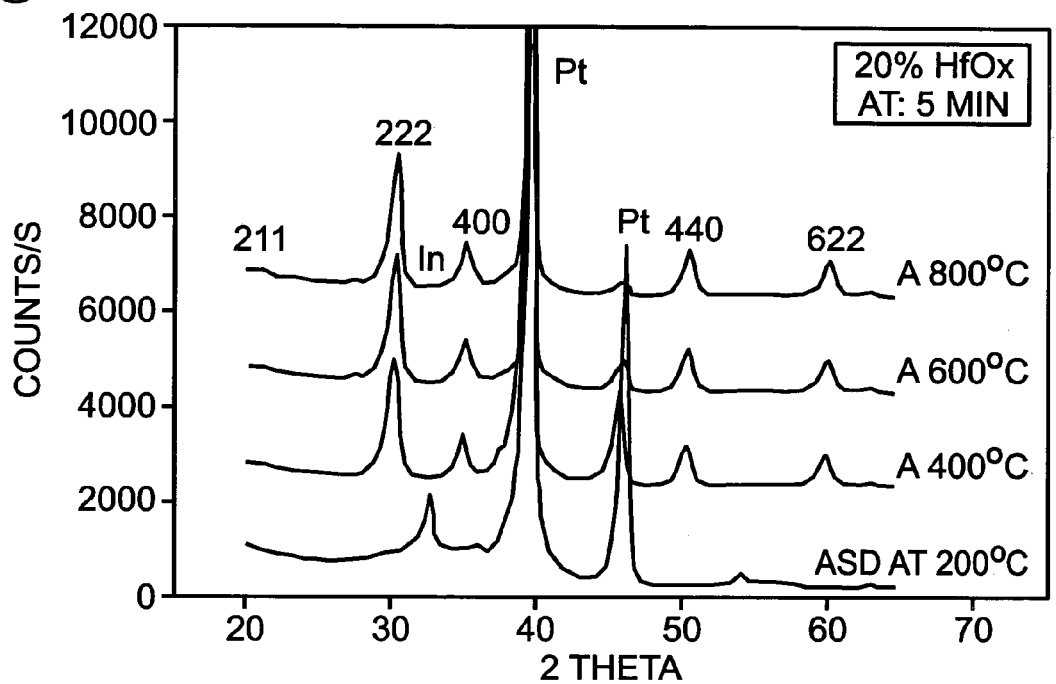
Figure 5A:
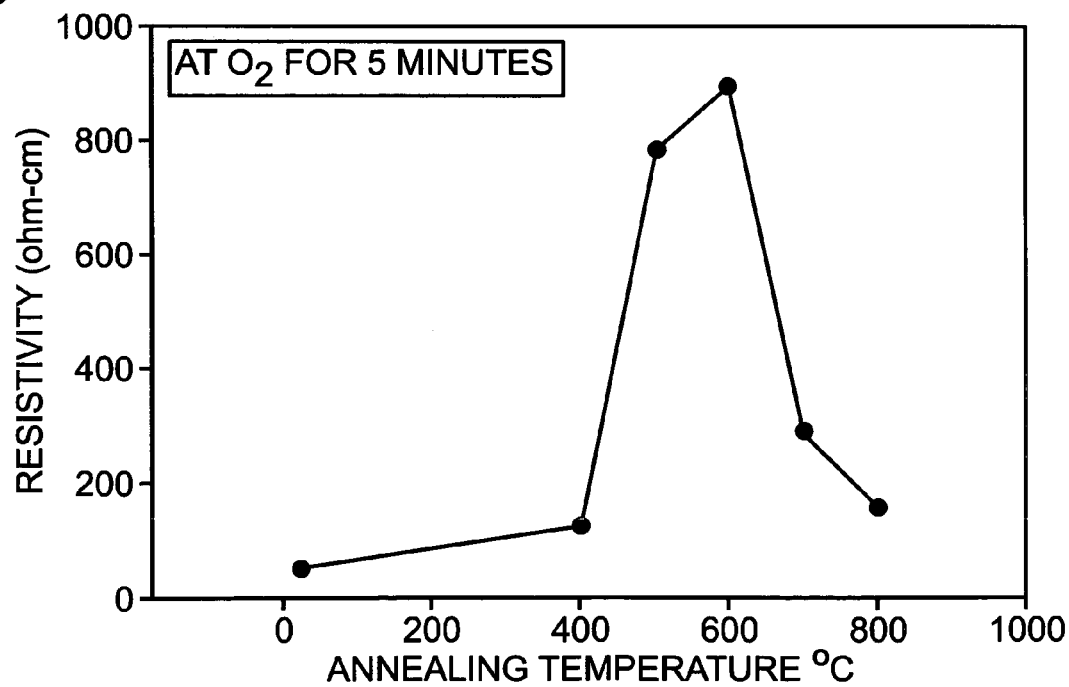
FIGS. 5A–D show the resistivity of doped $In_2O_3$ thin films with different post annealing temperatures.
Figure 5B:
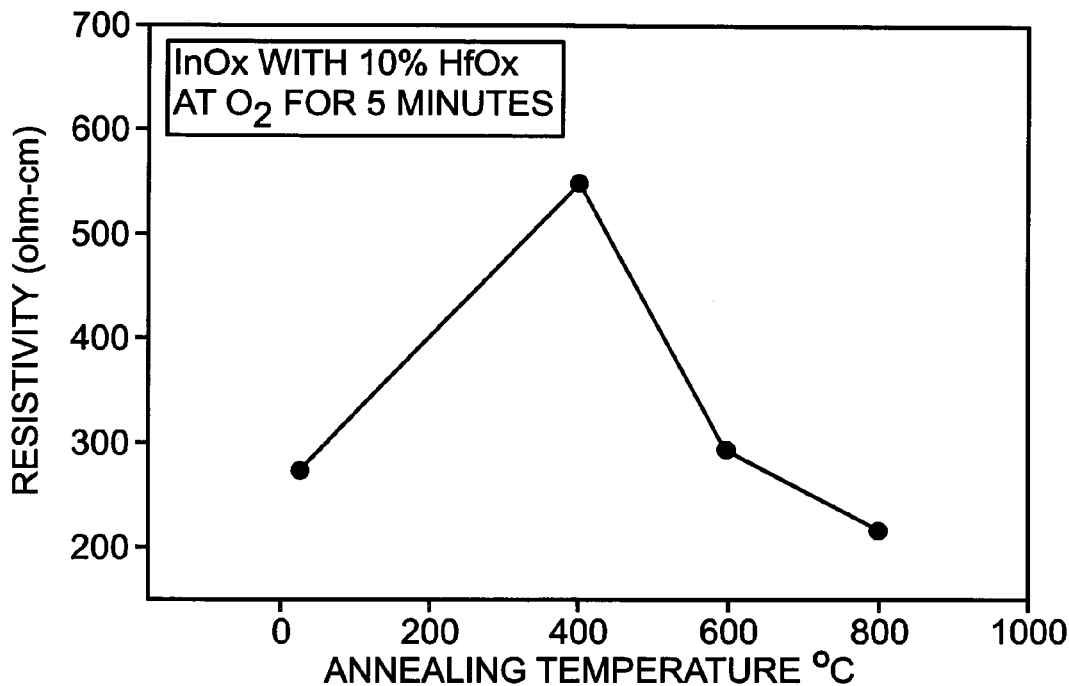
Figure 5C:
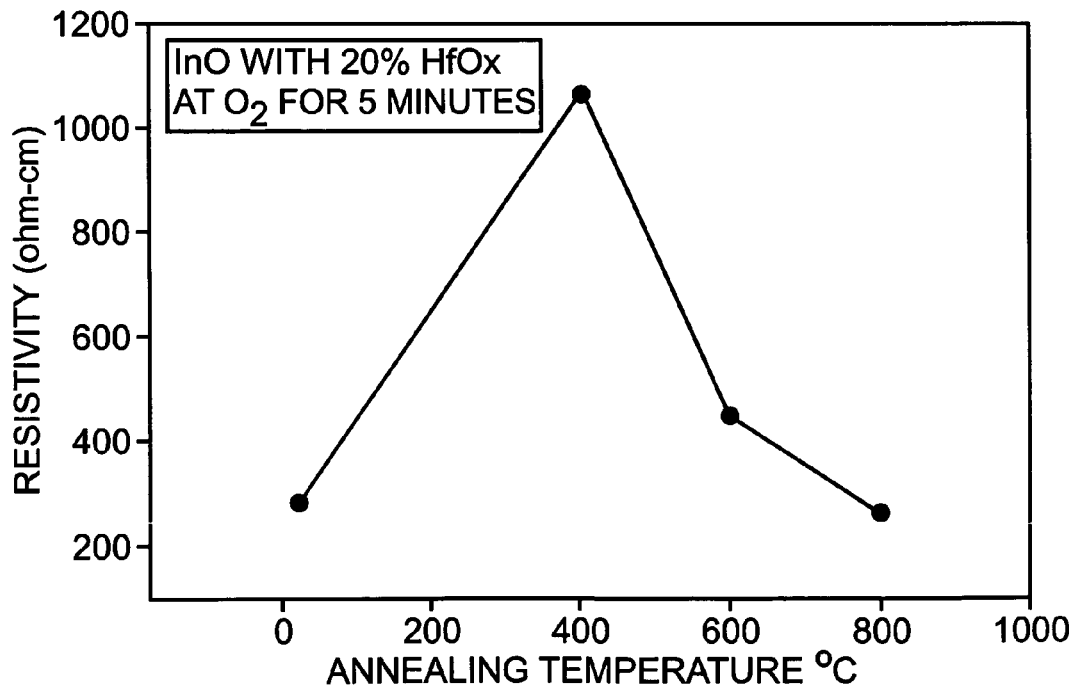
Figure 5D:
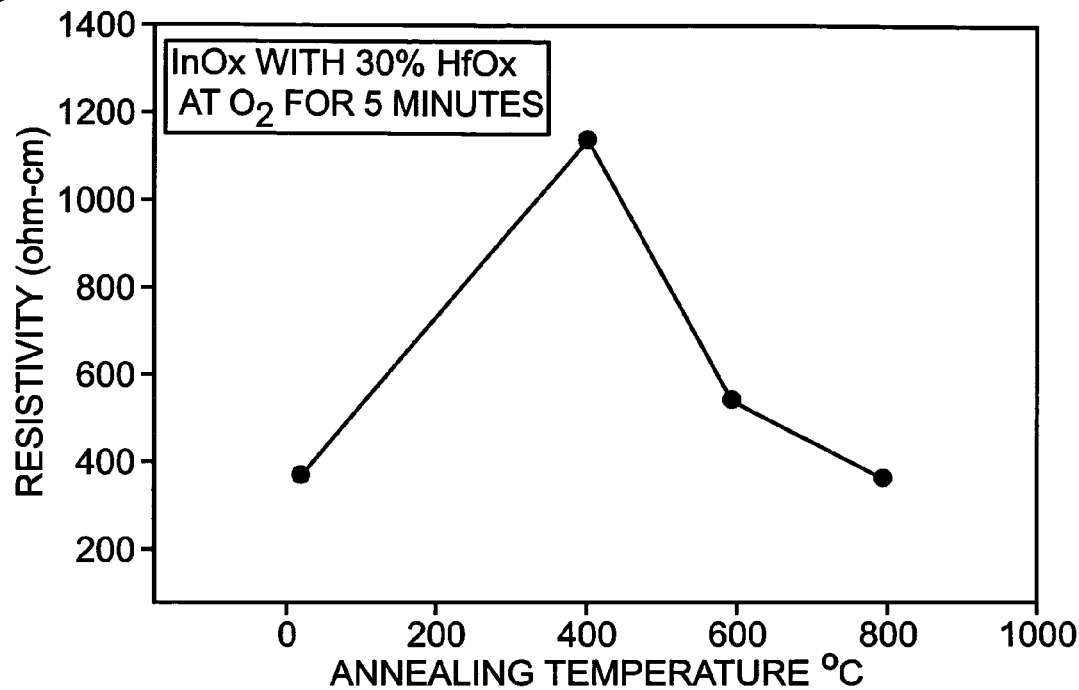

FIG. 3 shows the X-ray patterns of doped $In_2O_3$ thin films deposited on platinum substrate with various percentage (0, 10, 20, and 30%) of hafnium oxide at substrate temperature of 200° C. With increased percentage of hafnium oxide dopant, only the peaks of indium thin film decrease without any indication of hafnium oxide peaks, indicating that hafnium oxide exists in the $In_2O_3$ thin film as amorphous state.

FIGS. 4A, 4B, 4C, and 4D show the X-ray patterns of un-doped, 10% doped, 20% doped, and 30% doped $In_2O_3$ thin films at various annealing temperatures (400–800° C.) respectively, showing the effects of post annealing on the phase transformation of indium oxide thin film deposited on Pt. When deposited, the thin film consists of indium oxide phase with oxygen deficiency. After annealing at 400° C. for 5 minutes in oxygen ambient, the oxygen-poor indium oxide film is mostly transform into stochiometric indium oxide ($In_2O_3$) film. The $In_2O_3$ peaks increase with increasing annealing temperatures, which means the grain size of $In_2O_3$ thin film increases with increasing annealing temperatures. There are no peaks of hafnium oxide, thus the hafnium oxide exists in indium oxide film as an amorphous state. Even at the annealing temperature of 800° C. for 5 minutes, the hafnium oxide is still amorphous.

The effects of post annealing temperatures on the resistivity of indium oxide are shown in FIGS. 5A, 5B, 5C, and 5D for un-doped, 10% doped, 20% doped, and 30% doped $In_2O_3$ thin films respectively. After annealing in oxygen ambient for 5 minutes, the resistivity increases with increasing annealing temperature due to the indium oxidation. After reaching the maximum value at around 600° C. for un-doped indium oxide film and 400° C. for doped indium oxide films, the resistivity decreases with increasing temperatures due to the growth of the grain size.

Figure 6:
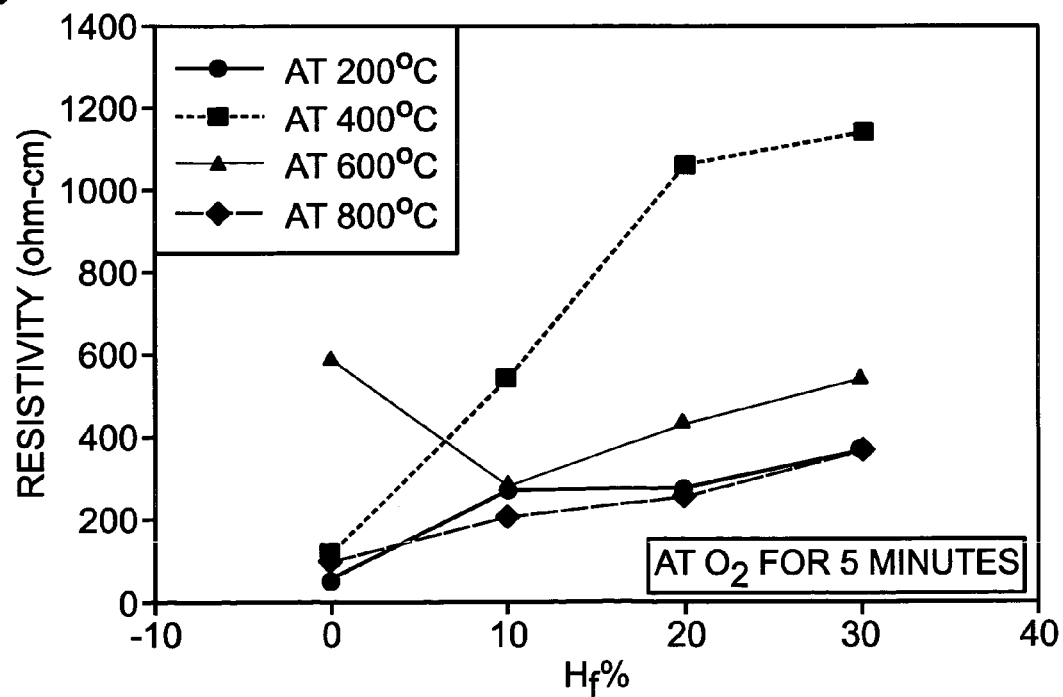
FIG. 6 shows the resistivity of doped $In_2O_3$ thin films with various hafnium oxide contents and post annealing temperatures.

FIG. 6 shows the dependencies of doped indium oxide resistivity with respect to dopant concentrations and post anneal temperatures. These data indicate that various physical and electrical properties of a resistive oxide film can be achieved by doping a conductive oxide layer with selective impurity species.

Figure 7:
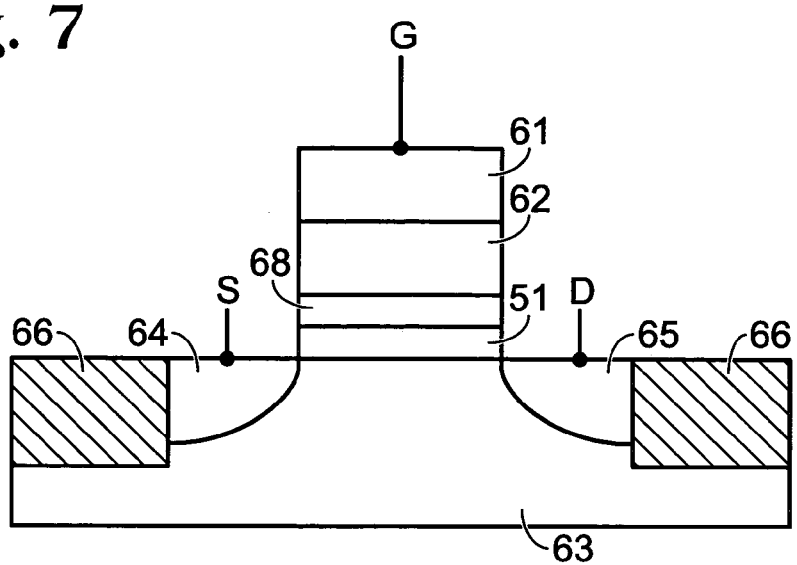
FIG. 7 shows a schematic of the present invention resistive oxide ferroelectric transistor.

Employing a doped conductive oxide film as a gate dielectric for the ferroelectric transistor, the first embodiment of the present invention is shown in FIG. 7, illustrating an n-channel doped conductive oxide gate ferroelectric transistor. The gate stack of the present invention comprises a top gate electrode 61, a ferroelectric film 62, a bottom gate electrode 68 and a doped conductive oxide gate 51, positioning on a p-type silicon substrate 63, and disposed between the source 64 and drain 65 regions having a high concentration of n-type impurity ions. The ferroelectric transistor is isolated by the isolation trenches 66. The gate insulator of the present invention transistor is replaced with a doped conductive oxide such as hafnium (or Zr, La, or Al) oxide doped $In_2O_3$ to prevent floating gate effect.

Figure 8A:
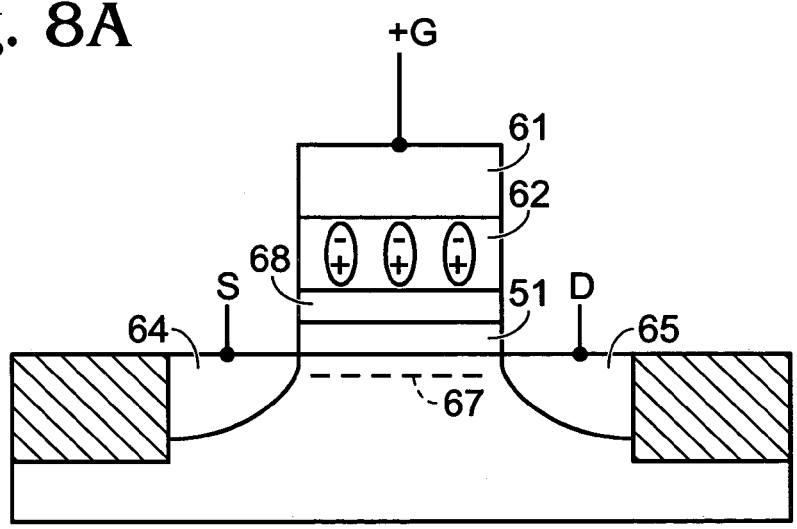
FIGS. 8A–B show the operation of the present invention doped conductive oxide ferroelectric transistor.
Figure 8B:
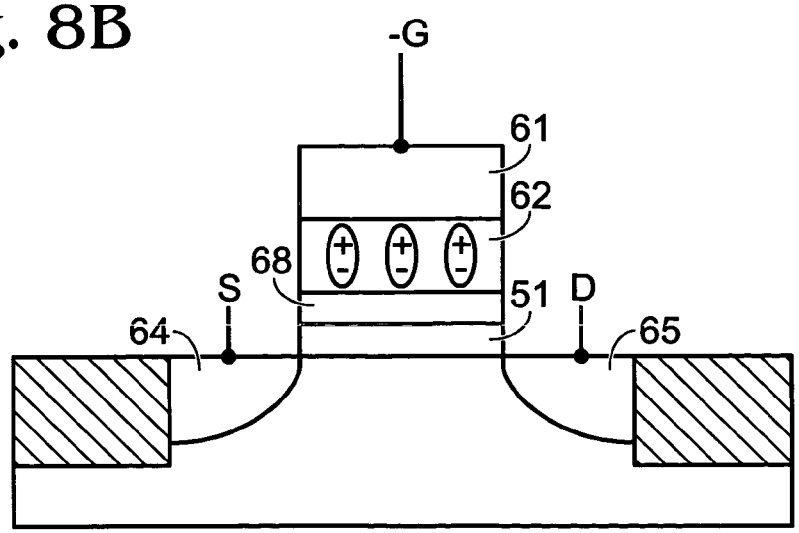

FIGS. 8A and 8B show the operation of the above n-channel doped conductive oxide ferroelectric transistor. In FIG. 8A, when a positive voltage is applied to the gate electrode 61, polarization of the ferroelectric film 62 occurs with electrons pulled to the top and holes pulled to the bottom of the ferroelectric film. Electrons are then accumulated at the doped conductive oxide and the surface of the silicon under the ferroelectric gate stack. This forms a high conductive channel 67. Therefore the ferroelectric transistor is "ON", i.e. if a voltage bias is placed across the source 64 and the drain 65, a current will flow through the transistor. The ferroelectric transistor memory is nonvolatile, meaning that the transistor remains in the ON state even after this positive voltage is removed due to the remnant polarization of the ferroelectric film 62.

In FIG. 8B, when a negative voltage is applied to the gate electrode 61, opposite polarization occurs in the ferroelectric film 62 with holes pulled to the top of the ferroelectric gate and electrons pulled to the bottom of the ferroelectric film. Holes then are accumulated at the doped conductive oxide and the surface of the silicon under the ferroelectric gate stack. There are no conduction channel 67, and the ferroelectric transistor is "OFF", i.e. a non-conduction state takes place between the source 64 and drain 65 regions, and is maintained even after the negative voltage is removed.

The doped conductive oxide prevents the bottom electrode 68 from direct contact to the n+ source and drain junctions. Since the bottom electrode 68 is connected to the silicon through the doped conductive oxide 51, the bottom electrode 68 is not electrically isolated, and therefore would not be able to accumulate charges as a floating gate. The charge retention time of this device is thus independent of the current flow through the ferroelectric thin film.

Figure 9:
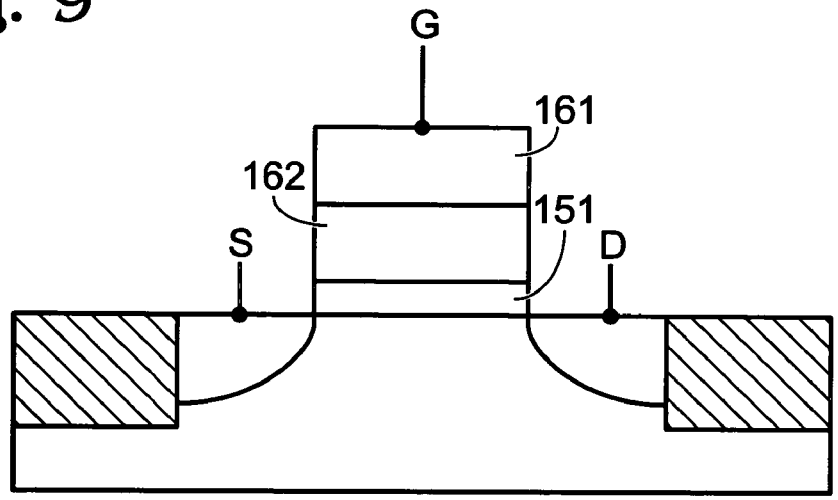
FIG. 9 shows another embodiment of the present invention doped conductive oxide ferroelectric transistor.

In the second embodiment of the invention, the bottom gate electrode is omitted. Thus the gate stack of the doped conductive oxide gate ferroelectric transistor comprises a top gate electrode 161, a ferroelectric film 162, and a doped conductive oxide gate 151 as shown in FIG. 9.

The doped conductive oxide in the present invention is preferably a doped conductive metal oxide, but can be without any metal component. The doped conductive oxide can make good interface with the silicon substrate, and can be selected to have a good lattice matching with the deposited ferroelectric film, especially the ones having perovskite crystal structures.

Furthermore, a doped conductive oxide serving as electrodes for the ferroelectric film may improve the quality of the ferroelectric film, and thus improving the operation of the ferroelectric transistor. A ferroelectric film is generally formed in an oxidizing ambience such as a deposition process with oxygen as a reactive gas, or an annealing process in an oxygen ambience to improve the stability of the deposited ferroelectric film. Therefore the electrode material for a ferroelectric film is preferable an oxidization resistant noble metal such as Pt and Ir. Doped conductive oxides is already oxidation resistant, and further, due to the high concentration of oxygen, the doped conductive oxide film can suppress the movement and accumulation of oxygen at the ferroelectric/doped conductive oxide interface to improve the reliability such as fatigue and the controllability of the ferroelectric and therefore its polarization property.

One further advantage of doped conductive metal oxide is its etch selectivity. Oxygen can be used as an etching gas for doped conductive metal oxides since the steam pressure of metal oxide is typically very high. The doped conductive metal oxide therefore can be etched with higher selective etching rate than other dielectric films. In addition, the doped conductive metal oxide and the metal can have high selective etching rate since the doped conductive metal oxide films ($RuO_2$, for example) normally cannot react easily with halogen such as F and Cl used for etching the metal films.

The ferroelectric material disclosed in the present invention is preferably any of the following: $Pb(Zr, Ti)O_3$ (PZT), $SrBi_2Ta_2O_9$ (SBT), $Pb5Ge_3O_{11}$ (PGO), $BaTiO_3$, or $LiNbO_3$, but any ferroelectric material exhibiting hysteresis effect can be employed in the conductive oxide ferroelectric transistor. The preferred ferroelectric compounds are, in order of preference, PGO, SBT and PZT.

The bottom electrode and the top electrode are preferably a metal layer such as aluminum, platinum or iridium, and more preferably a conductive layer, a conductive oxide layer, a conductive metal oxide layer, or a multilayer such as conductive oxide/metal, or conductive metal oxide/metal.

Within the scope of the invention, the disclosed resistive oxide ferroelectric transistor structure may also incorporate all the advanced features of the state of the art technology such as SOI or SIMOX substrate, halo or LDD source and drain, sidewall spacers for the gate stack, shallow trench isolation (STI) or LOCOS isolation, silicide formation such as titanium silicide, cobalt silicide, or nickel silicide, raised source and drain, passivation, tungsten or aluminum contact, aluminum or copper metallization.

The present invention further discloses the fabrication process for the doped conductive oxide ferroelectric transistor. Although the fabrication process for the doped conductive oxide ferroelectric transistor is illustrated and described below with reference to certain specific processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

One fabrication process for the doped conductive oxide ferroelectric transistor is a gate etching process, employing an etching process to form the gate stack and comprising the steps of:

Preparing a semiconductor substrate

Forming a gate stack on the substrate

Forming drain and source regions on opposite sides of the gate stack.

The device fabrication process is then completed with passivation and interconnect metallization steps.

Figure 10A:
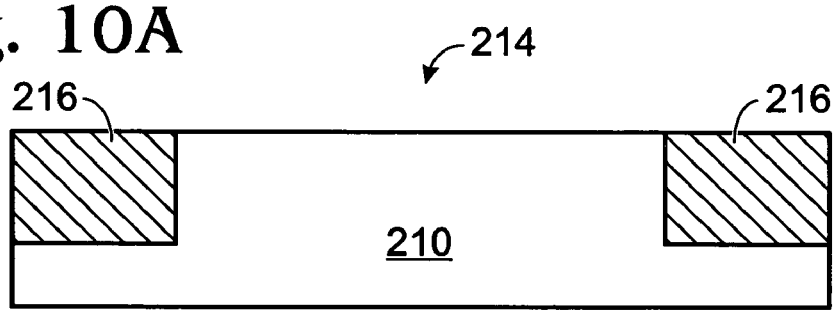
FIGS. 10A–F show a representative fabrication process for the gate etching process.

Preparing a Semiconductor Substrate, FIG. 10A:

The fabrication process starts with a substrate (p-type or n-type, bulk or silicon-on-insulator, SOI or SIMOX) and any state of the art suitable processes for the well formation and device isolation. FIG. 10A shows a p-type substrate 210 (similar fabrication process can be applied to an n-type substrate with appropriate corrections and adjustments) and shallow trench isolation (STI) 216 to form an active device area 214. For simplicity, important but unrelated details such as periphery devices, well formation process and active region threshold voltage adjustment, are not shown.

Figure 10B:
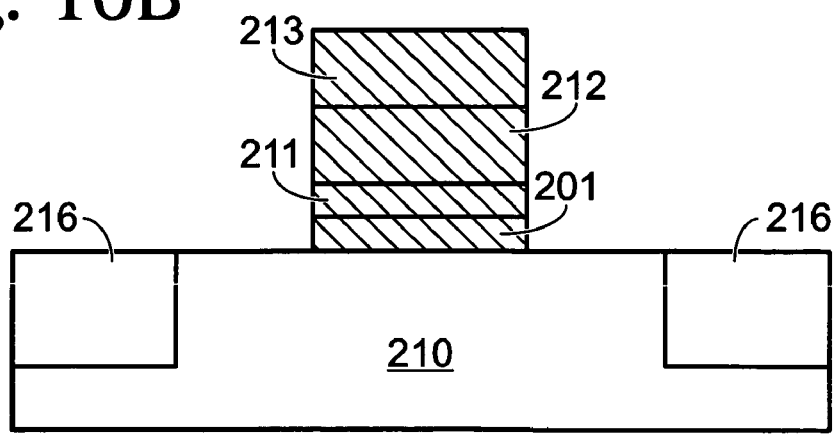

Forming a Gate Stack on the Substrate, FIG. 10B:

Then the gate stack multilayer of doped conductive oxide/bottom electrode/ferroelectric film/top electrode is deposited. In the second embodiment of the invention, the bottom electrode is omitted, and the gate stack multilayer comprises only of three layers: doped conductive oxide, ferroelectric film, and top electrode. The doped conductive oxide is perferably between 10 to 30 nm thick and is preferably hafnium oxide, zirconium oxide, lanthanum oxide or aluminum oxide doped $In_2O_3$, but can be any doped conductive oxide or resistive oxide materials as disclosed above. The bottom electrode is perferably between 50 to 200 nm thick and is perferably platinum or iridium, but can also be any conductive metal or conductive oxide materials. The ferroelectric layer is perferably between 50 to 300 nm thick and is perferably PGO, BST or PZT, but can be any ferroelectric material exhibiting hysteresis effect. The top electrode is perferably between 50 to 200 nm thick and is perferably aluminum, platinum or iridium, but can also be any conductive metal or conductive oxide materials. Furthermore, the electrode layers (either the bottom or the top electrode) can be a multilayer of metal and conductive oxide.

The gate stack multilayer is then patterned into a ferroelectric gate stack, comprising a top electrode 213, a ferroelectric 212, a bottom electrode 211, and a doped conductive oxide 201 as shown in FIG. 10B. The patterning of the gate stack multilayer is preferably by photolithography where a patterned mask is provided on the gate stack multilayer, then the gate stack multilayer is etched according to the pattern mask, and then the patterned mask is removed. The patterned mask is preferably a photoresist layer, coated and exposed to UV light under a photo mask to transfer a pattern from the photo mask onto the photoresist. The photoresist mask protects the gate stack multilayer during an etch step to transfer the pattern from the photoresist onto the gate stack multilayer. And then the photoresist mask can be stripped. The gate stack multilayer etching is preferably accomplished by reactive ion etching or by wet etches.

Figure 10C:
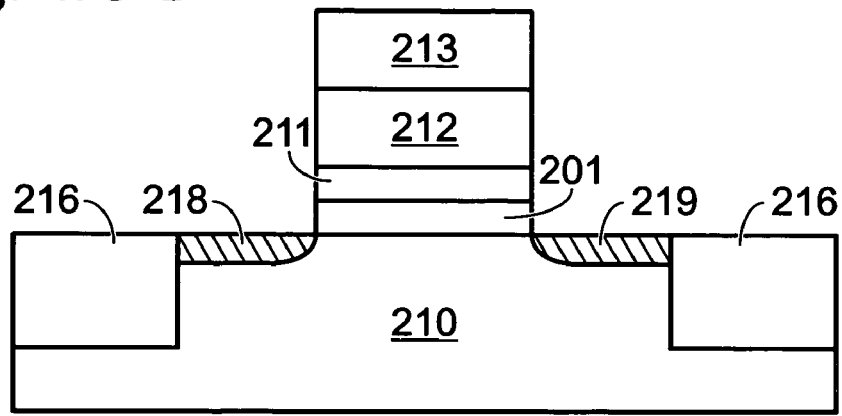

The next step is lightly doping drain (LDD) ion implantation into source 218 and drain 219 regions, although the ferroelectric memory transistor may or may not requires this LDD ion implantation. LDD implantation includes implantation of phosphorus ions at an energy level of 15 keV to 40 keV, or arsenic ions at an energy level of 30 keV to 60 keV. The doses of the LDD phosphorus or arsenic implantation are about $5 \times 10^{14}$ cm$^{-2}$ to $10^{15}$ cm$^{-2}$ (FIG. 10C), though the specific energy and dose values can be adjusted for optimizing the ferroelectric transistor operation.

Figure 10D:
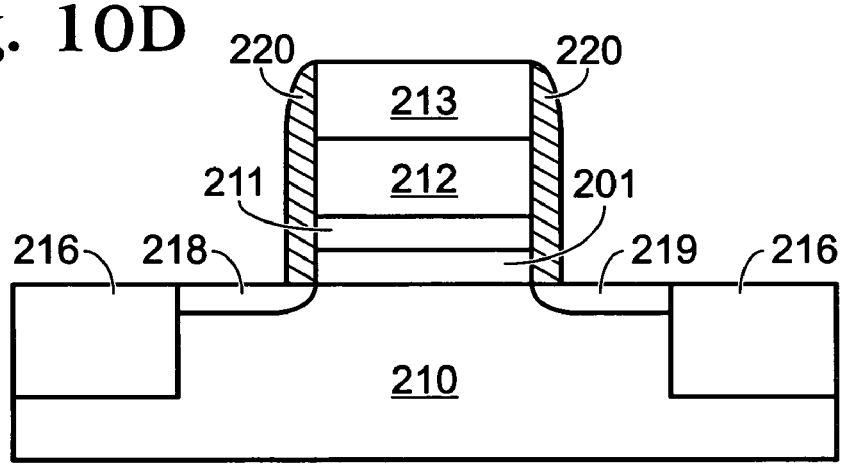

The next step is sidewall spacer formation. A layer of dielectric material such as silicon nitride or silicon dioxide is deposited onto the gate stack to a thickness of about between 20 to 80 nm, and then is anisotropic etched to leave a dielectric sidewall spacer 220 on the ferroelectric gate stack (FIG. 10D).

Figure 10E:
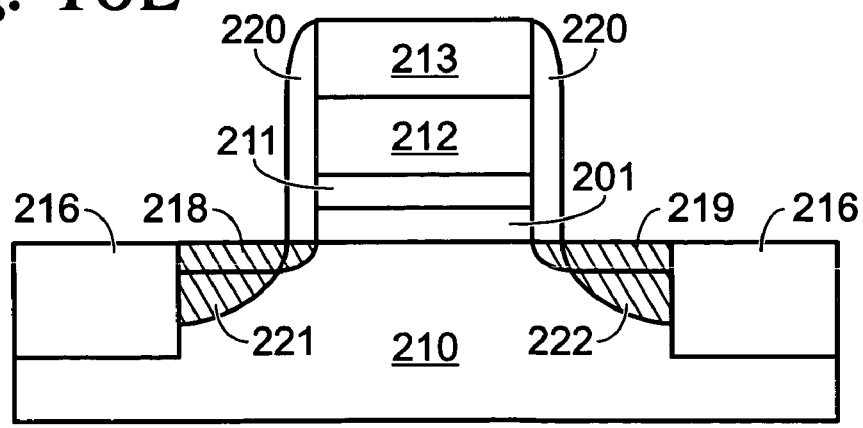

Forming Drain and Source Regions on Opposite Sides of the Gate Stack, FIG. 10E.

Then a source region 221 and a drain region 222 are formed by implantation of doping ions, for example arsenic at a dose of about $10^{15}$ cm$^{-2}$ to $5 \times 10^{15}$ cm$^{-2}$ and at an energy level of 15 keV to 30 keV (FIG. 10E).

Figure 10F:
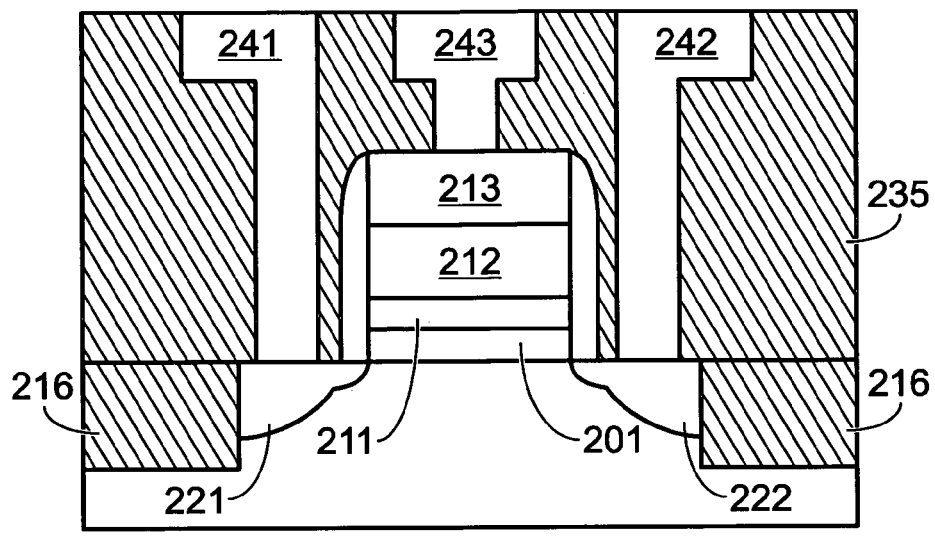

The device fabrication process is then completed with passivation and interconnect metallization steps, FIG. 10F. A passivation layer 235 such as silicon dioxide is deposited on the whole structure to a thickness of about 1000 to 2000 nm. The passivation layer may be planarized to improve the topology of the device. The structure is then annealed at a temperature of between about 400° C. to 500° C. for about 15 to 60 minutes. The passivation layer is then patterned, preferably by photolithography, to form contact holes, and then the fabrication process continued with first level metallization contact 241 to source 221, contact 243 to gate stack (top electrode 213, ferroelectric 212, bottom electrode 211 and doped conductive oxide 201), contact 242 to drain 222.

The gate etching process for the second embodiment of the present invention (the ferroelectric transistor with the gate stack of top electrode/ferroelectric/doped conductive oxide) is similar to the above gate etching process, with the exception of the omission of the bottom gate electrode steps, meaning no bottom gate electrode deposition and no bottom gate electrode etching.

Alternatively, the ferroelectric gate stack may be fabricated by a replacement gate process similar to Hsu et al., U.S. Pat. No. 6,274,421, entitled "Method of making metal gate sub-micron MOS transistor", hereby incorporated by reference. The fabrication process uses a replacement process to form the gate stack and comprises the steps of:

Preparing a semiconductor substrate

Forming a replacement gate stack comprising a sacrificial layer

Forming drain and source regions on opposite sides of the replacement gate stack Filling the areas surrounding the replacement gate stack while exposing a top portion of the replacement gate stack Removing the sacrificial layer portion of the replacement gate stack Forming the remainder of the gate stack.

The device fabrication process is then completed with passivation and interconnect metallization steps.

Figure 11A:
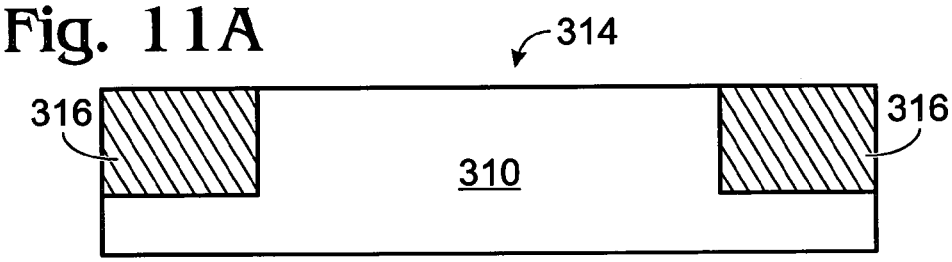
FIGS. 11A–K show a representative fabrication process for the replacement gate process.

Preparing a Semiconductor Substrate, FIG. 11A:

Similar to the gate etching process, the fabrication process starts with preparing a substrate (p-type or n-type, bulk or silicon-on-insulator, SOI or SIMOX) and any state of the art suitable processes for the well formation and device isolation. FIG. 11A shows a p-type substrate 310 (similar fabrication process can be applied to an n-type substrate with appropriate corrections and adjustments) and shallow trench isolation (STI) 316 to form an active device 314. For simplicity, important but unrelated details such as periphery devices, well formation process and active region threshold voltage adjustment, are not shown.

Figure 11B:
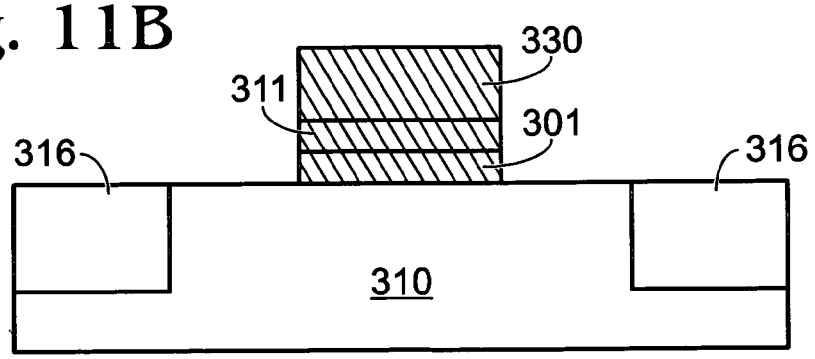

Forming a Replacement Gate Stack Comprising a Sacrificial Layer on the Substrate, FIG. 11B:

Then the multilayer replacement gate stack is deposited. The replacement gate stack serves as a place holder for the continued fabrication of the device, and will be removed before the fabrication of the functional gate stack. Thus the multilayer replacement gate stack comprises the first two layers (doped conductive oxide and bottom electrode) of the multilayer gate stack, and a sacrificial gate replacement layer. In the second embodiment of the invention where the bottom electrode of the gate stack is omitted, the replacement gate stack comprises only the doped conductive oxide layer and the sacrificial gate replacement layer. The doped conductive oxide is perferably between 10 to 30 nm thick and is preferably hafnium oxide, zirconium oxide, lanthanum oxide or aluminum oxide doped $In_2O_3$, but can be any doped conductive oxide or resistive material as disclosed above. The bottom electrode is perferably between 50 to 200 nm thick and is perferably platinum or iridium, but also can be any conductive material. The sacrificial gate replacement layer is preferably between about 100 to 300 nm thick and is preferably silicon nitride or silicon dioxide. Since the sacrificial gate replacement layer serves as a place holder for the functional gate stack, the thickness of the sacrificial layer is partially determined by the total thickness of the remainder of the functional gate stack.

The replacement gate stack multilayer is then patterned into a ferroelectric gate stack, comprising a replacement gate layer 330, a bottom electrode 311, and a doped conductive oxide 301 as shown in FIG. 11B. The patterning of the gate stack multilayer is preferably by photolithography and reactive ion etching.

Figure 11C:
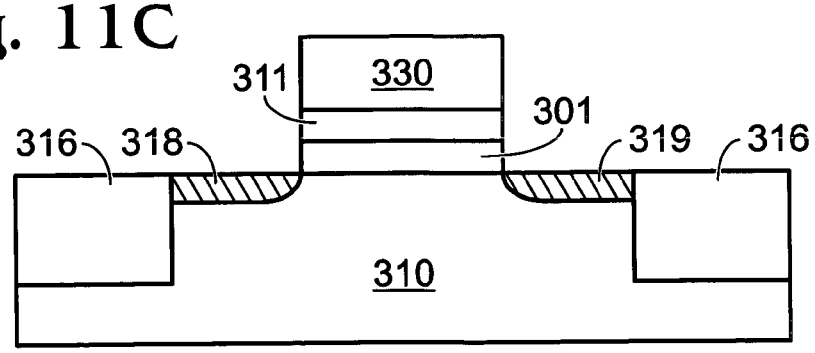

The next step is lightly doping drain (LDD) ion implantation into source 318 and drain 319 regions, although the ferroelectric memory transistor may or may not require this LDD ion implantation. LDD implantation includes implantation of phosphorus ions at an energy level of 15 keV to 40 keV, or arsenic ions at an energy level of 30 keV to 60 keV. The doses of the LDD phosphorus or arsenic implantation are about $5 \times 10^{14}$ cm$^{-2}$ to $10^{15}$ cm$^{-2}$ (FIG. 11C).

Figure 11D:
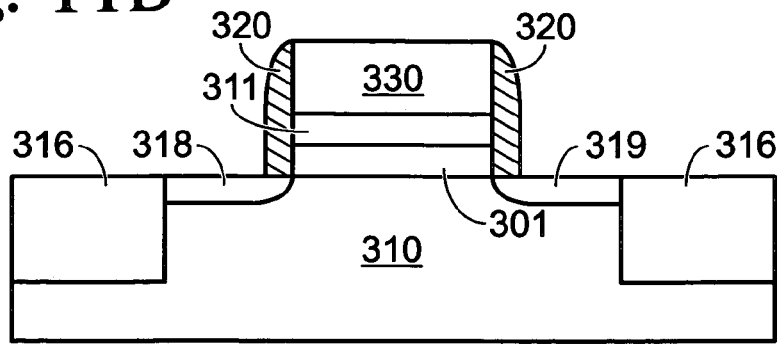

Then a layer of dielectric material such as silicon nitride or silicon dioxide is deposited onto the replacement gate stack to a thickness of about between 20 to 80 nm, and then is anisotropic etched to leave a dielectric sidewall spacer 320 on the ferroelectric gate stack (FIG. 11D).

Figure 11E:
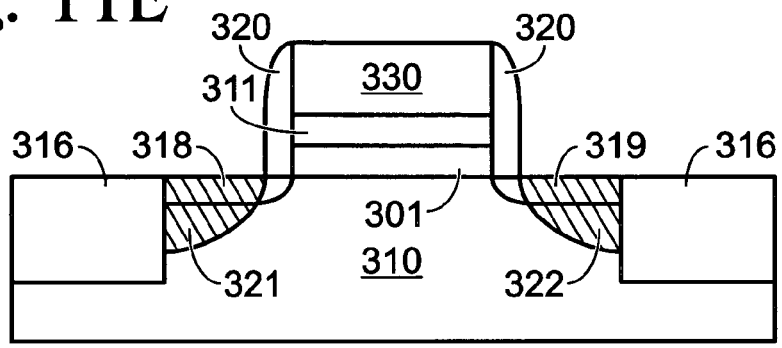

Forming Drain and Source Regions on Opposite Sides of the Replacement Gate Stack, (FIG. 11E):

Then a source region 321 and a drain region 322 are formed by implantation of doping ions, for example arsenic at a dose of about $10^{15}$ cm$^{-2}$ to $5 \times 10^{15}$ cm$^{-2}$ and at an energy level of 15 keV to 30 keV.

Figure 11F:
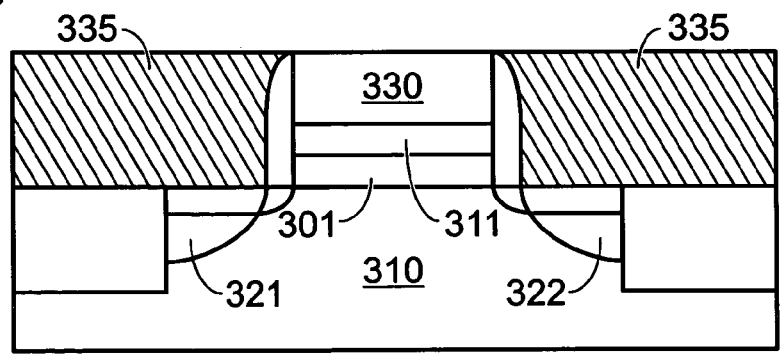

Filling the Areas Surrounding the Replacement Gate Stack While Exposing a Top Portion of the Replacement Gate Stack, FIG. 11F:

A dielectric layer 335 such as silicon dioxide is deposited on the whole structure. The dielectric layer is then planarized, preferably by a chemical mechanical polishing (CMP) process. The thickness of the dielectric layer is preferably about 50% thicker than the replacement gate layer 330 to prevent dishing during planarization.

Figure 11G:
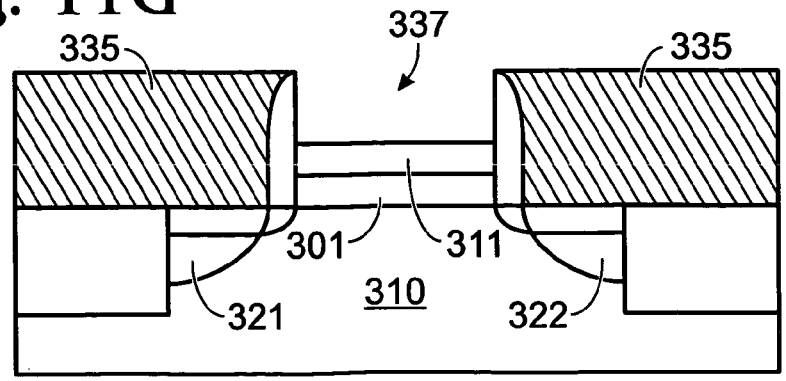

Removing the Sacrificial Layer Portion of the Replacement Gate Stack, FIG. 11G:

The replacement gate layer 330 is removed to expose a gate trench 337, preferably by a wet etch process to prevent damage to the surrounding structure.

Figure 11H:
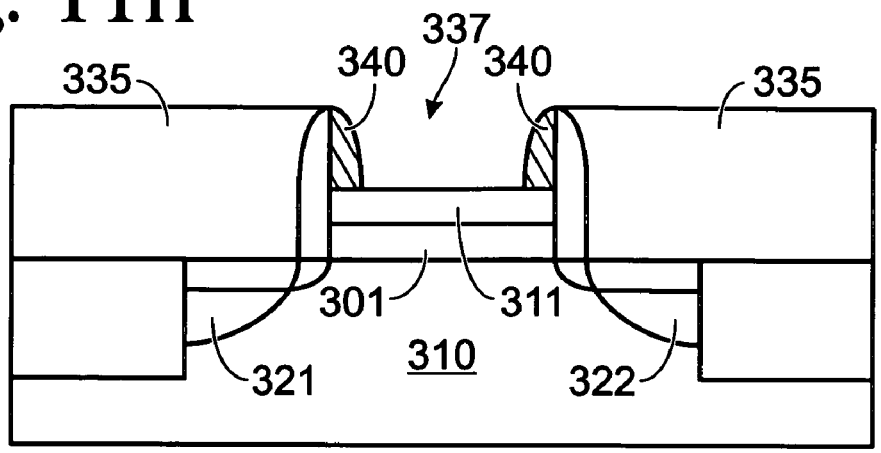

An optional spacer 340 can be formed in the sidewall of the gate trench. The spacer formation is preferably by depositing a layer of silicon nitride of about 10 to 30 nm thick, and then anisotropically etched (FIG. 11H).

Figure 11I:
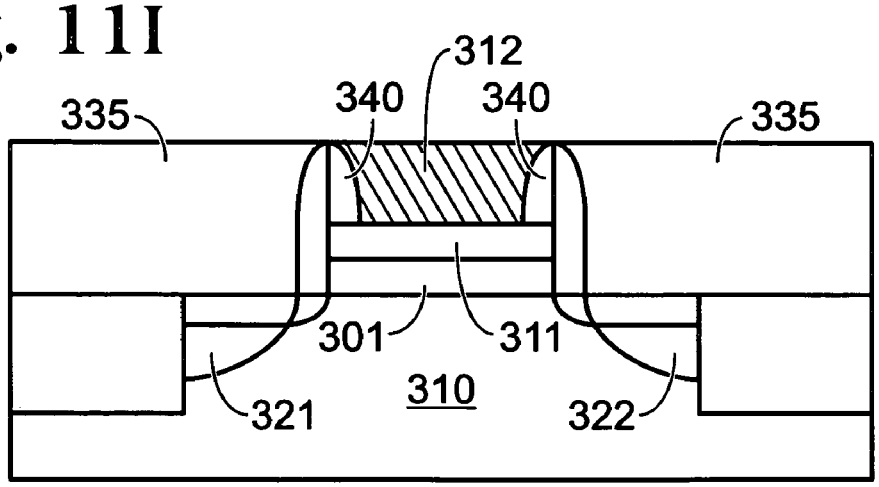

Forming the Remainder of the Gate Stack, FIG. 11I:

The ferroelectric layer is then deposited into the gate trench. The ferroelectric layer is perferably PGO, BST or PZT, but can be any ferroelectric material exhibiting hysteresis effect. The thickness of the ferroelectric layer is preferably slightly thicker than the depth of the gate trench to minimize the dishing effect during the subsequent CMP process of planarizing the ferroelectric layer 312.

Figure 11J:
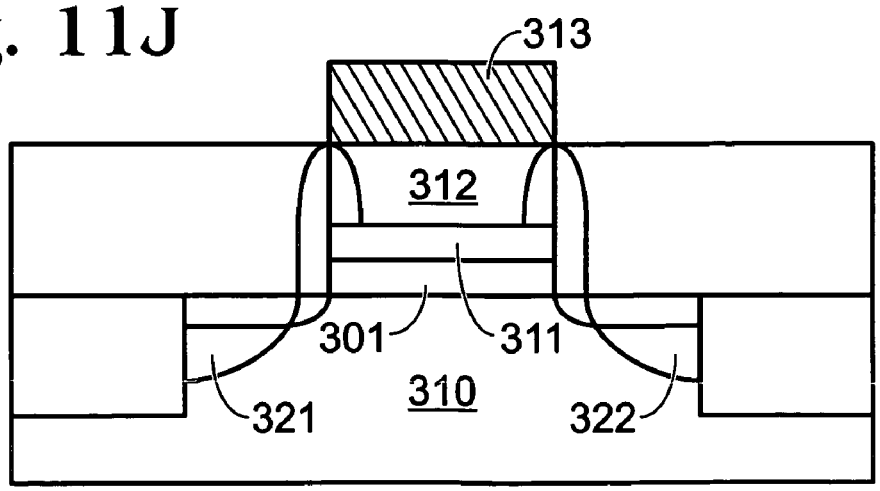

The top electrode 313 is then fabricated on the feroelectric layer 312. The top electrode formation is preferably by depositing a blanket layer of top eletrode material, and then is patterned into the top electrode, preferably by photolithography and reactive ion etching techniques (FIG. 11J). The top electrode is perferably between 50 to 200 nm thick and is perferably aluminum, platinum or iridium, but also can be any conductive material.

Figure 11K:
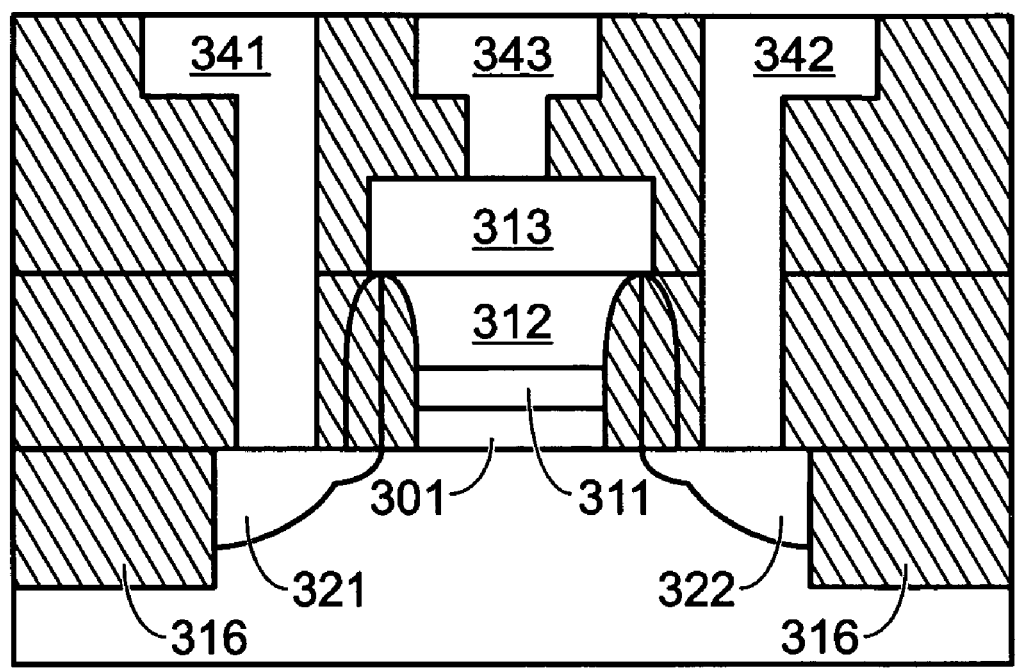

The device fabrication process is then completed with passivation and interconnect metallization steps, FIG. 11K. A passivation layer such as silicon dioxide is deposited on the whole structure to a thickness of about 300 to 500 nm. The structure is then annealed at a temperature of between about 400° C. to 500° C. for about 15 to 60 minutes. The passivation layer is then patterned, preferably by photolithography, to form contact holes, and then the fabrication process continued with first level metallization contact 341 to source 321, contact 343 to gate stack (top electrode 313, ferroelectric 312, bottom electrode 311 and doped conductive oxide 301), contact 342 to drain 322.

The replacement gate process for the second embodiment of the present invention (the ferroelectric transistor with the gate stack of top electrode/ferroelectric/doped conductive oxide) is similar to the above replacement process, with the exception of the omission of the bottom gate electrode steps, meaning no bottom gate electrode deposition and no bottom gate electrode etching.

Thus a novel ferroelectric transistor and its memory cell application has been disclosed, together with the method of device fabrication. It will be appreciated that though preferred embodiments of the invention have been disclosed, further variations and modifications thereof may be made within the scope of the invention as defined in the appended claims. Further, although the invention has been described with reference to a ferroelectric transistor for use with nonvolatile memory applications, other applications of the inventive concepts disclosed herein will also be apparent to those skilled in the art.

What is claimed is:

1. A method of fabricating a ferroelectric transistor comprising the steps of:
    preparing a semiconductor substrate;
    forming a gate stack on the substrate, the gate stack comprising a conductive oxide overlying the substrate;
    doping the conductive oxide using an impurity species;
    modifying the resistance of the conductive oxide in response to the impurity species, forming a doped conductive oxide; and
    forming drain and source regions on opposite sides of the gate stack.

2. A method as in claim 1 wherein the I–V characteristic of the doped conductive oxide is substantially linear.

3. A method as in claim 1 wherein the gate stack further comprises
    a ferroelectric material layer over the doped conductive oxide layer; and
    a top electrode conductive layer over the ferroelectric material layer.

4. A method as in claim 1 wherein the gate stack further comprises
    a bottom electrode conductive layer over the doped conductive oxide layer;
    a ferroelectric material layer over the bottom electrode layer; and
    a top electrode conductive layer over the ferroelectric material layer.

5. A method as in claim 3 wherein the top electrode conductive layer is selected from the group consisting of a layer of metal, a layer of conductive oxide, or a multilayer of metal and conductive oxide.

6. A method as in claim 1 wherein the doped conductive oxide layer comprises a conductive perovskite oxide, a high temperature superconducting oxide, or an oxide film of any metal selected from a group consisted of Mo, W, Tc, Re, Ru, Os, Rh, Ir, Pd, Pt, In, Zn, Sn, Nd, Nb, Sm, La, and V.

7. A method as in claim 1 wherein the conductive oxide is indium oxide.

8. A method as in claim 1 wherein the impurity species is selected from a groups consisting of Hf, Zr, Al, La, hafnium oxide, zirconium oxide, aluminum oxide and lanthanum oxide.

9. A method as in claim 1 wherein the doped conductive oxide is indium oxide doped with hafnium oxide, zirconium oxide, lanthanum oxide or aluminum oxide.

10. A method as in claim 1 wherein the gate stack is a replacement gate stack further comprising a sacrificial layer over the doped conductive oxide layer, and the fabrication method further comprising the following steps
    filling the areas surrounding the replacement gate stack while exposing the top portion of the replacement gate stack;
    removing the sacrificial layer portion of the replacement gate stack;

forming the remainder of the gate stack, the remainder of the gate stack comprising
    a ferroelectric material layer over the conductive oxide layer; and
    a top electrode conductive layer over the ferroelectric material layer.

11. A method as in claim 10 wherein the replacement gate stack further comprises a bottom electrode conductive layer positioned between the conductive oxide layer and the sacrificial layer.

12. A method as in claim 10 wherein the filling of the areas surrounding the replacement gate stack while exposing a top portion of the replacement gate stack comprises
    the deposition of a dielectric film; and
    the planarization of the deposited dielectric film to expose the top portion of the replacement gate stack.

13. A method as in claim 10 wherein the formation of the remainder of the gate stack comprises
    the deposition of the ferroelectric material layer;
    the planarization of the ferroelectric material layer;
    the deposition of the top electrode conductive layer;
    the photolithography patterning of the top electrode conductive layer; and
    the etching of the top electrode conductive layer.

14. A method of fabricating a ferroelectric transistor comprising:
    supplying a semiconductor substrate;
    forming an indium oxide layer overlying the substrate;
    doping the indium oxide with an impurity species;
    modifying the resistance of the indium oxide, forming a doped indium oxide layer;
    forming a ferroelectric material layer overlying the doped indium oxide layer;
    forming a gate top electrode conductive layer overlying the ferroelectric material layer; and
    forming drain and source regions.

15. The method of claim 14 further comprising:
    forming a bottom electrode interposed between the doped indium oxide layer and the ferroelectric material layer.

16. A method of fabricating a ferroelectric transistor comprising:
    supplying a silicon (Si) substrate;
    forming a metal oxide layer overlying the substrate;
    doping the metal oxide layer with an impurity species;
    in response to the doping, forming a conductive metal oxide layer;
    forming a gate stack overlying the conductive oxide layer;
    forming source and drain regions;
    in response to forming the conductive oxide layer, preventing elements from diffusing into the Si substrate from the gate stack; and
    in response to forming the conductive oxide layer, forming an electrically conductive path between the gate stack and the Si substrate.

17. The method of claim 16 wherein forming the gate stack includes:
    forming a ferroelectric material layer overlying the conductive oxide layer;
    forming a gate top electrode conductive layer overlying the ferroelectric material layer.

18. The method of claim 17 wherein forming the gate stack further includes:
    forming a bottom electrode interposed between the conductive oxide layer and the ferroelectric material layer.

* * * * *